US011959966B2

United States Patent
Orban et al.

(10) Patent No.: US 11,959,966 B2
(45) Date of Patent: Apr. 16, 2024

(54) METHOD FOR ESTIMATING AN OPERATING STATE OF AN ELECTRICAL SWITCHING APPARATUS AND ELECTRICAL SWITCHING APPARATUS FOR IMPLEMENTING SUCH A METHOD

(71) Applicant: Schneider Electric Industries SAS, Rueil Malmaison (FR)

(72) Inventors: Rémy Orban, Saint Martin d'Uriage (FR); Vincent Geffroy, Shanghai (CN)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 17/591,025

(22) Filed: Feb. 2, 2022

(65) Prior Publication Data

US 2022/0252667 A1 Aug. 11, 2022

(30) Foreign Application Priority Data

Feb. 4, 2021 (FR) ...................................... 2101081

(51) Int. Cl.
*G01R 31/327* (2006.01)
*G01R 19/00* (2006.01)
(Continued)

(52) U.S. Cl.
CPC ....... *G01R 31/327* (2013.01); *G01R 19/0092* (2013.01); *H01H 47/22* (2013.01); *H01H 50/44* (2013.01); *H01H 50/54* (2013.01)

(58) Field of Classification Search
CPC .............. G01R 31/327; G01R 31/3278; G01R 19/0092; H01H 50/44; H01H 50/54
See application file for complete search history.

(56) References Cited

U.S. PATENT DOCUMENTS 6,249,418 B1   6/2001  Bergstrom
6,262,648 B1 * 7/2001  Lammers ............... H01H 50/32
                                                        335/229
(Continued)

FOREIGN PATENT DOCUMENTS

FR   2919109 A1    1/2009
JP   2006004902 A  1/2006

OTHER PUBLICATIONS

French Search Report and Written Opinion dated Oct. 24, 2021 for corresponding French Patent Application No. FR2101081, 10 pages.

*Primary Examiner* — Dominic E Hawkins
(74) *Attorney, Agent, or Firm* — Locke Lord LLP

(57) ABSTRACT

A method for estimating the state of an electrical switching apparatus, the switching apparatus including separable electrical contacts configured to be coupled to an electrical conductor, and an electromagnetic actuator, controlled by a control circuit and including a movable core, coupled to the separable contacts, and a coil, which is passed through by a coil current. The method: includes measuring, by means of sensors associated with the coil, values of the coil current in a time interval, while the electromagnetic actuator is kept in a stable and in particular closed position, and computing, by means of an electronic control device of the switching apparatus, one or more values of a magnetic flux of the coil from the measured coil-current values, and using coil-voltage and coil-resistance values known beforehand.

20 Claims, 9 Drawing Sheets

(51) Int. Cl.
*H01H 47/22* (2006.01)
*H01H 50/44* (2006.01)
*H01H 50/54* (2006.01)

(56) References Cited

U.S. PATENT DOCUMENTS

| | | |
|---|---|---|
| 6,859,350 B1 * | 2/2005 | Corbetta .............. H01H 33/593 |
| | | 361/139 |
| 7,109,720 B2 | 9/2006 | Baurand et al. |
| 9,293,243 B2 * | 3/2016 | Kim ...................... H01F 7/1615 |
| 11,355,292 B2 * | 6/2022 | Elmiger ................ H01H 47/26 |
| 2009/0138212 A1 | 5/2009 | Maruyama |
| 2016/0258276 A1 * | 9/2016 | Donderici ................ E21B 7/04 |
| 2016/0293364 A1 * | 10/2016 | Hahn .................... H01F 7/1844 |
| 2017/0110274 A1 * | 4/2017 | Hahn .................... H01H 50/66 |
| 2018/0316296 A1 * | 11/2018 | Hajati ...................... H02P 6/16 |
| 2019/0074148 A1 * | 3/2019 | Takasuka ................ H01F 7/064 |

* cited by examiner

METHOD FOR ESTIMATING AN OPERATING STATE OF AN ELECTRICAL SWITCHING APPARATUS AND ELECTRICAL SWITCHING APPARATUS FOR IMPLEMENTING SUCH A METHOD

TECHNICAL FIELD

The present invention relates to a method for estimating an operating state of an electrical switching apparatus and an electrical switching apparatus for implementing such a method.

The invention more specifically relates to the electrical contactors.

BACKGROUND

Such electrical switching apparatus comprise an electromagnetic actuator comprising a fixed coil and a movable core and are set up to switch between an open and a closed state, for example, to control the electrical power supply of an electrical load. Generally, the electrical contacts comprise fixed contacts and movable contacts, with the movable contacts being connected to the movable core that moves under the effect of a magnetic field created by the coil when the coil is passed through by a suitable electrical current.

With each switching cycle, the contactor wears out due to various factors. For example, the electrical contacts wear out due to electrical arcs that are created when the electrical contacts are opened, and the friction within the mechanism increases due to the accumulation of dust and/or particles associated with worn parts, which degrades the performance capabilities of the actuator.

It is desirable to be able to automatically estimate the states of a contactor when it is operating, in order to schedule appropriate maintenance during the lifetime of the contactor and/or to detect the occurrence of malfunctions.

Integrating a position sensor into the electromagnetic actuator, in order to directly measure the displacement or the position of the movable parts of the actuator and to deduce a state of the contactor therefrom, often is not a suitable solution, since the use of a sensor makes the actuator more expensive and complex to manufacture, and it is not always possible to integrate a sensor into a contactor.

Document WO-03/054895-A1 describes a diagnostic method based on a measurement of the travel time of the movable core of the electromagnetic actuator during the closing phase. Such a diagnostic method is only applicable when the core is moving and therefore cannot be used during the other operating phases of the actuator.

SUMMARY

The invention is more specifically intended to address these problems, by proposing a diagnostic method that is more precise.

To this end, the invention relates to a method for estimating the state of an electrical switching apparatus, the switching apparatus comprising separable electrical contacts set up to be coupled to an electrical conductor, and an electromagnetic actuator, controlled by a control circuit and comprising a movable core, coupled to the separable contacts, and a coil, which is passed through by a coil current. According to the invention, the method comprises the following steps:

measuring, by means of sensors associated with the coil, a value of the coil current during a time interval, while the electromagnetic actuator is kept in a stable position, in particular a closed position;

computing, by means of an electronic control device of the switching apparatus, one or more values of a magnetic flux of the coil, from the measured coil current value, and using previously known coil voltage and coil resistance values.

By virtue of the invention, the magnetic flux variations are assessed even when the core is stationary. Since the magnetic flux value is different depending on whether the movable core of the electromagnetic actuator is in the open or closed position, the magnetic flux measurement allows the state of the actuator to be assessed without having to add an additional sensor, which allows more precise diagnosis of the state of the switching apparatus.

According to advantageous but non-compulsory aspects of the invention, such a method can incorporate one or more of the following features taken individually or according to any technically permissible combination:

The one or more values of a magnetic flux are computed by integrating the following formula:

$$\phi = \int \frac{U_{BOB} - R_{BOB} \cdot I_{BOB}}{N_{BOB}} dt,$$

where $N_{BOB}$ is a number of turns of the coil.

A first value of the magnetic flux is computed from measurements of the coil current taken while the switching apparatus is in a freewheeling mode, in which the coil voltage is passively limited by the control circuit, while the coil current decreases freely, with the electrical energy being mainly dissipated by the coil resistance.

A second magnetic flux value is computed from measurements of the coil current taken during an increasing portion that immediately precedes the freewheeling phase during which the measurements of the coil current are taken that are used to compute the first value of the magnetic flux, with the coil voltage being imposed by the control circuit.

The first magnetic flux value and the second magnetic flux value are computed from measurements of the coil current that are taken during a closing phase of the switching apparatus.

A coil current spike is applied using the electronic control device during a test phase included in a holding phase of the switching apparatus, during which the coil current has a holding current value that is strictly higher than a stall value of the coil current, below which the electromagnetic actuator is not kept energized in the closed position, with the trend of the coil current having an increasing portion, during which the measurements of the coil current are taken that are used to compute the second value of the magnetic flux, and a decreasing portion, during which the measurements of the coil current are taken that are used to compute the first value of the magnetic flux.

The coil resistance is measured during a stable portion of the holding phase, which precedes the test phase, with the measured value of the coil resistance then being used in the step of computing the second value of the magnetic flux and the first value of the magnetic flux during said test phase.

The one or more computed values of magnetic flux are normalized and combined with at least one other measured and/or computed electrical quantity of the electrical switching apparatus, with each other electrical quantity measurement also being normalized, so as to arrive at an intermediate indicator of the state of the electromagnetic actuator.

A closing phase of the switching apparatus comprises a dynamic phase, during which the coil voltage is controlled by the electronic control device, followed by a transition phase, during which the switching apparatus is in a freewheeling mode, whereas during the dynamic phase the trend of the coil current increases a first time beyond a first threshold, which is linked to a drop-out current of the switching apparatus, beyond which the movable core starts to move from its open position to its closed position, then the trend of the coil current decreases below the first threshold, reaches a minimum value, and then again rises a second time above the first threshold;

a second threshold of the coil current is defined, with the second threshold being between the first threshold and the minimum value, the measured coil current is lower than the second threshold, and provided that the trend of the coil current exceeds the first threshold a second time, an integral of the difference between the coil current and the second threshold is computed over a time interval defined between a first instant when the trend of the coil current decreases below the second threshold and a second instant when the coil current again rises above the second threshold, and said integral is one of the other electrical quantities combined to form the intermediate indicator.

a value of the coil current is measured over a time interval by means of sensors associated with the coil, while the electromagnetic actuator is kept in a stable position, in particular a closed position, and the switching apparatus is in a freewheeling mode, in which the coil voltage is passively limited by the control circuit, while the coil current decreases freely, with the electrical energy being mainly dissipated by the coil resistance, while a coil inductance value of the coil is computed by means of an electronic control device of the switching apparatus from the measured coil current value and using previously known coil voltage and coil resistance values;

and the coil inductance is one of the other electrical quantities used to form the intermediate indicator.

The electromagnetic actuator comprises a magnetic circuit made of a material, wherein the coil inductance is computed from measurements of the coil current taken from an area of the coil current where the material of the magnetic circuit has magnetic saturation of less than 80% of a maximum magnetic saturation of this material, preferably less than 50%.

The steps of measuring the coil current and of computing the coil inductance are repeated over several time intervals, with an average inductance value being deduced from the coil inductance values computed during each time interval, whereas each time interval has a duration ranging between 0.01 ms and 10 ms, preferably ranging between 0.1 ms and 1 ms, more preferably equal to 0.2 ms, and the value of the coil inductance is averaged over at least ten time intervals, preferably over at least twenty time intervals.

One of the other measurements of electrical quantity is a measurement of a pole current, passing through a pole of the electrical conductor, and/or a control state of the electronic control device.

According to another aspect, the invention relates to an electrical switching apparatus for implementing an estimation method as described above, with the switching apparatus being set up to be coupled to an electrical conductor and comprising:

separable contacts, moved between an open position and a closed position by an electromagnetic actuator comprising a coil and a movable core linked to the separable contacts;

a circuit for controlling the electrical voltage at the terminals of the coil, called "coil voltage", the control circuit comprising a device called "fallback" device, which can be selectively activated to reduce the electrical current, called "coil current", passing through the coil with the coil voltage and the fallback device being activated or deactivated according to the states of the control circuit;

sensors associated with the coil for measuring the coil current;

an electronic control device, set up to receive opening and closing commands from the switching apparatus, to receive the values of the coil current measurements and to control the states of the control circuit;

wherein, while the electromagnetic actuator is kept in a stable position, in particular a closed position, the switching apparatus is set up to implement a diagnostic method comprising the following steps:

measuring, by means of the sensors associated with the coil, coil current values over a time interval;

computing, by means of the electronic control device, a value of a magnetic flux of the coil, from the measured coil current values, and using previously known values of the coil voltage and coil resistance.

BRIEF DESCRIPTION OF THE DRAWINGS

The invention will be better understood, and further advantages thereof will become more clearly apparent in the light of the following description of two embodiments of a method in accordance with its principle and of an electrical switching apparatus for implementing these methods, which description is provided solely by way of an example and with reference to the drawings, in which.

DETAILED DESCRIPTION

Figure 1:
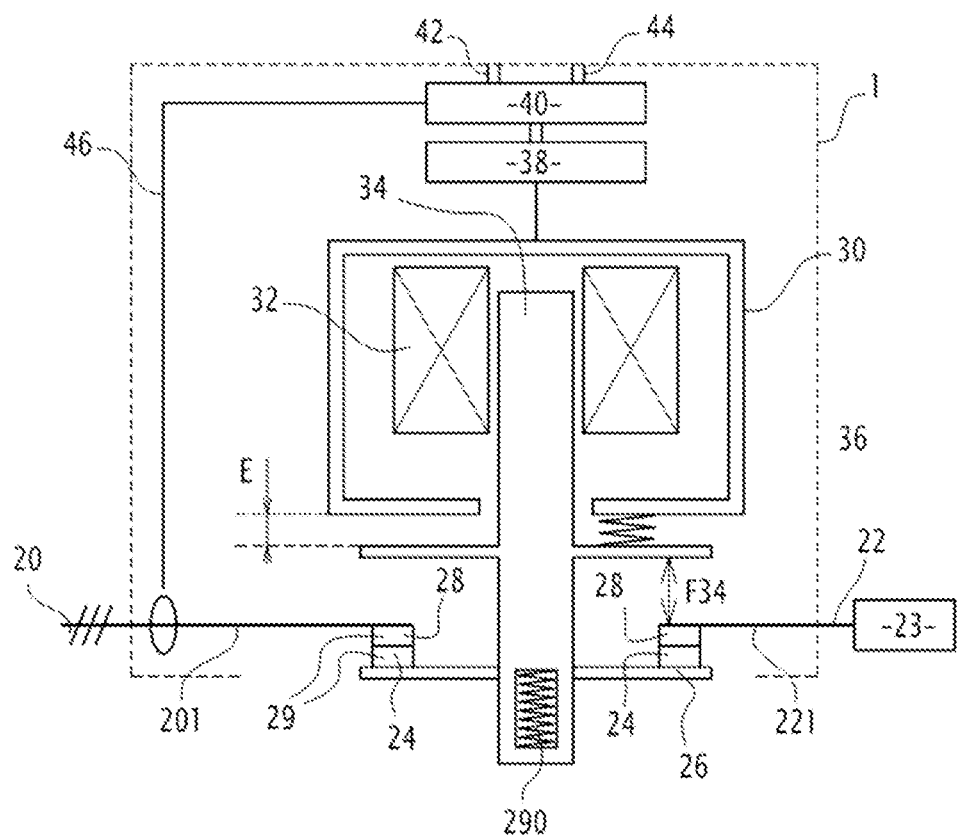
FIG. 1 is a schematic view of an electrical switching apparatus comprising an electromagnetic actuator according to embodiments of the invention.

A contactor 1 is shown in FIG. 1. The contactor 1 is an example of an electrical switching apparatus intended to control the supply of electrical energy from an electrical energy source to an electrical load 23. The source of electrical energy is not drawn in order to simplify the figures. The energy source is, for example, an electrical power supply network, while the electrical load 23 is, for example, an electric motor, which is intended to be controlled by means of the contactor 1. The contactor 1 is generally housed in a casing, shown herein as a dashed-line rectangle. The contactor 1 is set up to be coupled, on the one hand, to an upstream electrical conductor 20 connected to a source of electrical energy and, on the other hand, to a downstream line 22 connected to the electrical load 23. When the contactor 1 allows the electrical current to pass through and the electrical load 23 is supplied with energy, the contactor 1 is in a state called "closed" state, whereas when the contactor 1 prevents the passage of electrical energy to the electrical load, the contactor 1 is in a state called "open" state.

The electrical conductor 20 and the downstream line 22 comprise the same number of phases. When the source of electrical energy is polyphase, the electrical conductors 20 and the downstream line 22, which each comprise conductive members that are isolated from each other, have the same number of conductive members as each other, with each conductive member of the downstream line 22 being associated with a respective member of the upstream electrical conductor 20. Irrespective of the number of phases, the contactor 1 is set up to interrupt, or allow through, the electrical current together in each of the phases.

In the illustrated example, the upstream electrical conductor 20 is three-phase. The conductive members in this case are conductive wires. Only one of the conductive wires of the electrical conductor 20, referenced 201, is shown in FIG. 1. Only the conductive wire of the power line 22 associated with the conductor 201 is shown, with this conductive wire of the power line 22 being referenced 221. In a non-limiting alternative embodiment, the conductive members are rigid buses.

The remainder of the description is provided with reference to the conductive wires 201 and 221, which are associated with the same phase of the power supply current, with it being understood that the description that is provided is applicable to the other phases of the power supply current.

For each phase, the contactor 1 comprises movable contacts 24, arranged on a movable bar 26, and fixed contacts 28, respectively linked to the upstream 20 and downstream 22 conductors. Each of the movable 24 and fixed 28 contacts comprises contact pads 29, in this case made of metal, preferably silver alloy or any equivalent material.

The movable bar 26 is movable between a closed position, in which the movable contacts 24 are electrically connected to the fixed contacts 28 and electrical energy can circulate through the movable bar 26 from the upstream electrical conductor 20 to the downstream line 22, and an open position, in which the movable contacts 24 are remote from the fixed contacts 28.

When the movable bar 26 is in the closed position, the contactor 1 is in the closed state, whereas when the bar 26 is in the open position, the contactor 1 is in the open state. The transition from the open to the closed state is a closing phase of the contactor 1, whereas the transition from the closed state to the open state is an opening phase of the contactor 1.

In practice, during each cycle comprising a closing and an opening phase, the contact pads 29 wear out, for example, under the action of electrical arcs during opening, or even by material tearing caused by micro-welds. This loss of material causes the thickness of the contact pads 29 to decrease over the lifetime of the contactor 1, which increases the range of movement of the bar 26 during the opening or closing phases. To address this issue, the contactor 1 comprises a mechanism 290, schematically shown by a spring in FIG. 1, which is linked to the bar 26 and allows the fixed 28 and movable 24 contacts to be kept in electrical contact with a sufficient contact pressure.

The movable bar 26 is controlled by an electromagnetic actuator 30, which comprises a control electromagnet with a coil 32, a core 34 connected to the movable bar 26 and a return component 36, for example, a spring or equivalent. The coil 32 is set up to generate a magnetic field when it is supplied with a control electrical current, in order to move the core 34, and therefore the movable bar 26. The electromagnetic actuator 30 in this case is a linear actuator, which has a variable reluctance Rel, particularly depending on the position of the core 34.

The movements of the core 34 between the open and closed positions are shown by a double-headed arrow F34. In other words, the movable contacts 24 and the associated fixed contacts 28 together form separable contacts, which are associated with the electrical conductor 20 and which are moved between an open position and a closed position by the electromagnetic actuator 30, which comprises a coil 32 and a movable core 34 linked to the separable contacts.

In FIG. 1, the contactor 1 is shown in an intermediate configuration between the stable open and closed states of the contactor 1, in which the fixed 28 and movable 24 contacts are electrically connected, but the core 34 is not in abutment in the closed position. The mechanism 290 allows overtravel E of the core 34 between the time when the fixed contacts 28 make contact with the movable contacts 24, and the time when the electromagnetic actuator 30 is in the stable closed position.

The electromagnetic actuator 30 is controlled by means of a power supply circuit 38, which itself is controlled by an electronic control device 40. The coil 32 is thus connected to the electronic control device 40.

According to some embodiments, the electronic control device 40 comprises a logic computation unit, also called CPU, such as a programmable microcontroller or a microprocessor or equivalent, and a computer memory forming a medium for storing computer-readable data.

According to examples, the memory is a ROM, or a RAM, or a non-volatile memory of the EPROM or Flash or equivalent type. The memory comprises executable instructions and/or computer code for operating the control device 40 in accordance with one or more of the embodiments described below when executed by the logic computation unit.

According to alternative embodiments, the electronic control device 40 can comprise a signal processing processor (DSP), or a reprogrammable logic component (FPGA), or a specialized integrated circuit (ASIC), or any equivalent element.

The electronic control device 40 is itself connected to a power supply rail 42 and comprises an interface 44 set up to receive, from a user, commands to open or close the contactor 1. The electronic control device 40 is shown herein as being integrated into the contactor 1. As an alternative embodiment, the control device 40 is remote, i.e. it is not integrated into the same casing as the electromagnetic actuator 30.

The power supply rail 42 is intended to supply energy to the electronic control device 40 and to the power supply circuit 38. Depending on the cases, the power supply rail 42 has a DC or AC voltage. The method described herein is suitable for a power supply rail 42 having an AC or DC voltage, the amplitude of which typically ranges between 24 V and 500 V. In the illustrated example, the voltage of the power supply rail 42 is a 50 Hz AC voltage at 230 V.

The interface 44 is shown herein by control electrodes. For example, a control electrical voltage can be applied between the control electrodes. Optionally, the interface 44 comprises wireless communication means.

In some embodiments, the contactor 1 also comprises current sensors 46, set up to measure a current circulating in each of the phases of the upstream line 20, in other words, a current circulating in each of the conductive wires 201 of the upstream line 20. In other embodiments, the current sensors 46 and the electronic control device 40 are integrated in a separate casing of the contactor 1.

When the coil 32 is supplied with electrical energy from the power supply rail 42, an excitation current passes through the coil 32, which generates an electromagnetic force that tends to draw the core 34 and the bar 26 from the open position to the closed position. A return component 36, shown herein by a spring, exerts a return force that opposes the attractive force of the electromagnet.

A coil current $I_{BOB}$ is defined as an excitation current circulating through the coil 32.

A drop-out current ID is defined as being a threshold of the coil current $I_{BOB}$ which, when the actuator 30 is in the open state, allows the actuator 30 to move to the closed state, as soon as the coil current $I_{BOB}$ increases beyond the drop-out current ID.

A stall current $I_S$ is defined as being a threshold of the coil current $I_{BOB}$ which, when the actuator 30 is in the closed state, allows the actuator 30 to move to the open state, as soon as the coil current $I_{BOB}$ decreases below the stall current $I_S$.

Thus, when the actuator 30 is in the open state, as long as the coil current $I_{BOB}$ remains below the drop-out current ID, the movable core 34 is pushed back to the open position by the return component 36 of the actuator 30 and the contactor 1 remains in the open state. If the coil current $I_{BOB}$ increases beyond the drop-out current $I_D$, the electromagnetic force of the coil 32 becomes greater than the return force of the component 36 and the core 34 then moves from its open position to its closed position. Such a situation corresponds to a closing phase of the contactor 1.

Conversely, when the actuator 30 is in the closed state, as long as the coil current $I_{BOB}$ remains higher than the stall current $I_S$, the contactor 1 remains in the closed state. If, while the contactor 1 is in the closed state, the coil current $I_{BOB}$ decreases below the stall current $I_S$, the electromagnetic force of the coil 32 becomes weaker than the return force of the component 36 and of the mechanism 290, the core 34 is then pushed back from its closed position to its open position under the effect of the return component 36 and the mechanism 290. Such a situation corresponds to an opening phase of the contactor 1.

Generally, the drop-out current $I_D$ is greater, as an absolute value, than the stall current $I_S$. The values of the drop-out $I_S$ and stall $I_S$ currents are adjusted when the actuator 30 is designed, in particular by adjusting the properties of the coil 32 or the return forces of the component 36 and the mechanism 290.

Figure 2:
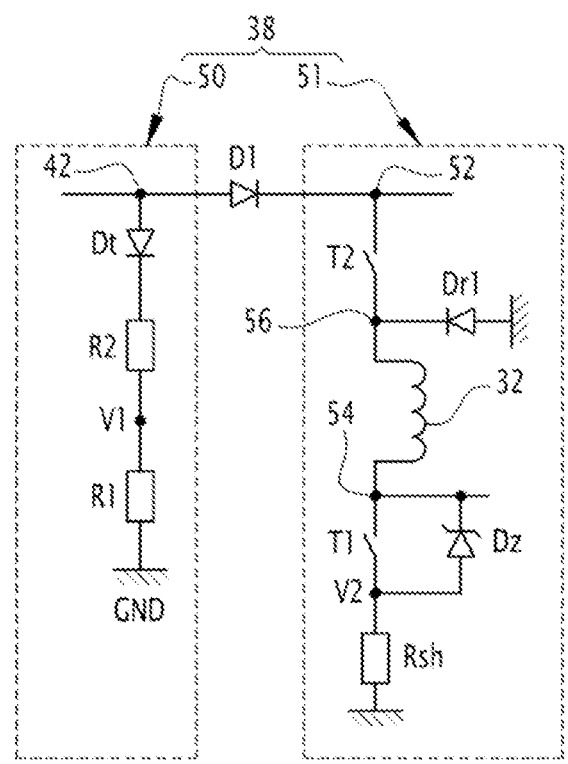
FIG. 2 is a schematic view of an example of the control circuit of the electromagnetic actuator of the switching apparatus of FIG. 1.

An embodiment of the power supply circuit 38 is schematically shown in FIG. 2. The architecture of the power supply circuit 38 is not limiting, and other implementations of the various components of the power supply circuit 38 are possible, or even other electrical or electronic components can be used to fulfil the same functions.

Preferably, the power supply circuit 38 comprises a measurement circuit 50, defined by a dashed-line outline, set up to measure the value of the electrical voltage between the power supply rail 42 and an electrical ground GND of the power supply circuit 38.

For example, the measurement circuit 50 comprises two resistors R1 and R2 connected in series with a diode Dt between the power supply rail 42 and the electrical ground GND. A first measurement point, in this case placed between the resistors R1 and R2, allows a first measurement voltage V1 to be collected that represents the electrical voltage present between the power supply rail 42 and the electrical ground GND. With the electrical voltage present between the rail 42 and the ground GND being linked to the coil voltage $U_{BOB}$, by extension the measurement circuit 50 is an example of a sensor set up to measure the coil voltage $U_{BOB}$.

The power supply circuit 38 comprises a control circuit 51, which includes the coil 32. A diode D1 can be placed on the power supply rail 42 between the control circuit 51 and the measurement circuit 50 to prevent any current from flowing back to the measurement circuit 50. The diodes D1 and Dt preferably are of the same type.

The control circuit 51 is shown herein in a configuration called "fallback" configuration, which is subsequently described in the present description.

The control circuit 51 comprises a power supply terminal 52, which is connected to the power supply rail 42. The coil 32 comprises two terminals 54 and 56. An electrical voltage measurement between the terminals 54 and 56 thus allows a coil voltage, denoted $U_{BOB}$, to be measured.

The terminal 54 is connected to ground GND by means of a switch called "fallback" switch T1. In many embodiments, a resistor called "shunt resistor" Rsh is connected in series with the fallback switch T1 in order to collect a second measurement voltage V2 representing the electrical current passing through the coil 32, in other words representing the coil current $I_{BOB}$. In the illustrated example, the shunt resistor Rsh is connected between the fallback switch T1 and the ground GND. The resistor Rsh is an example of a sensor set up to measure the intensity of the coil current $I_{BOB}$ circulating in the coil 32.

The terminal 56 is connected, on the one hand, to the terminal 52 by means of a power supply switch T2 and is connected, on the other hand, to ground GND by means of a "freewheeling" diode Drl. The freewheeling diode Drl has a blocking direction oriented towards the terminal 56.

The switches T1 and T2 are switches controlled by a control signal originating from the electronic control device 40. In other words, the electronic control device 40 is set up to control states of the control circuit 51.

According to embodiments, the switches T1 and T2 are semiconductor power switches, such as Mosfet transistors, or thyristors, or insulated gate bipolar transistors (IGBT), or any other equivalent device.

The control circuit 51 comprises a "fallback" device Dz, in this case produced by means of a Zener diode and connected parallel to the fallback switch T1. Thus, when the fallback switch T1 is open, the coil current $I_{BOB}$ passes through the fallback device Dz, whereas when the fallback switch T1 is closed, the fallback device Dz is short-circuited and no current passes through the fallback device Dz. This allows the fallback device Dz to be selectively activated to reduce the coil current $I_{BOB}$.

The coil 32 has a coil resistance denoted $R_{BOB}$ and a coil inductance denoted $L_{BOB}$. The resistance $R_{BOB}$ and the inductance $L_{BOB}$ particularly depend on the geometry of the coil 32, the materials used, the temperature, etc. In both embodiments of the method, the inductance $L_{BOB}$ is measured, as will be subsequently explained in the present description. In the first embodiment of the method, the coil resistance $R_{BOB}$ is measured, whereas in the second embodiment of the invention, the coil resistance $R_{BOB}$ is considered to be known, as explained hereafter.

Figure 3:
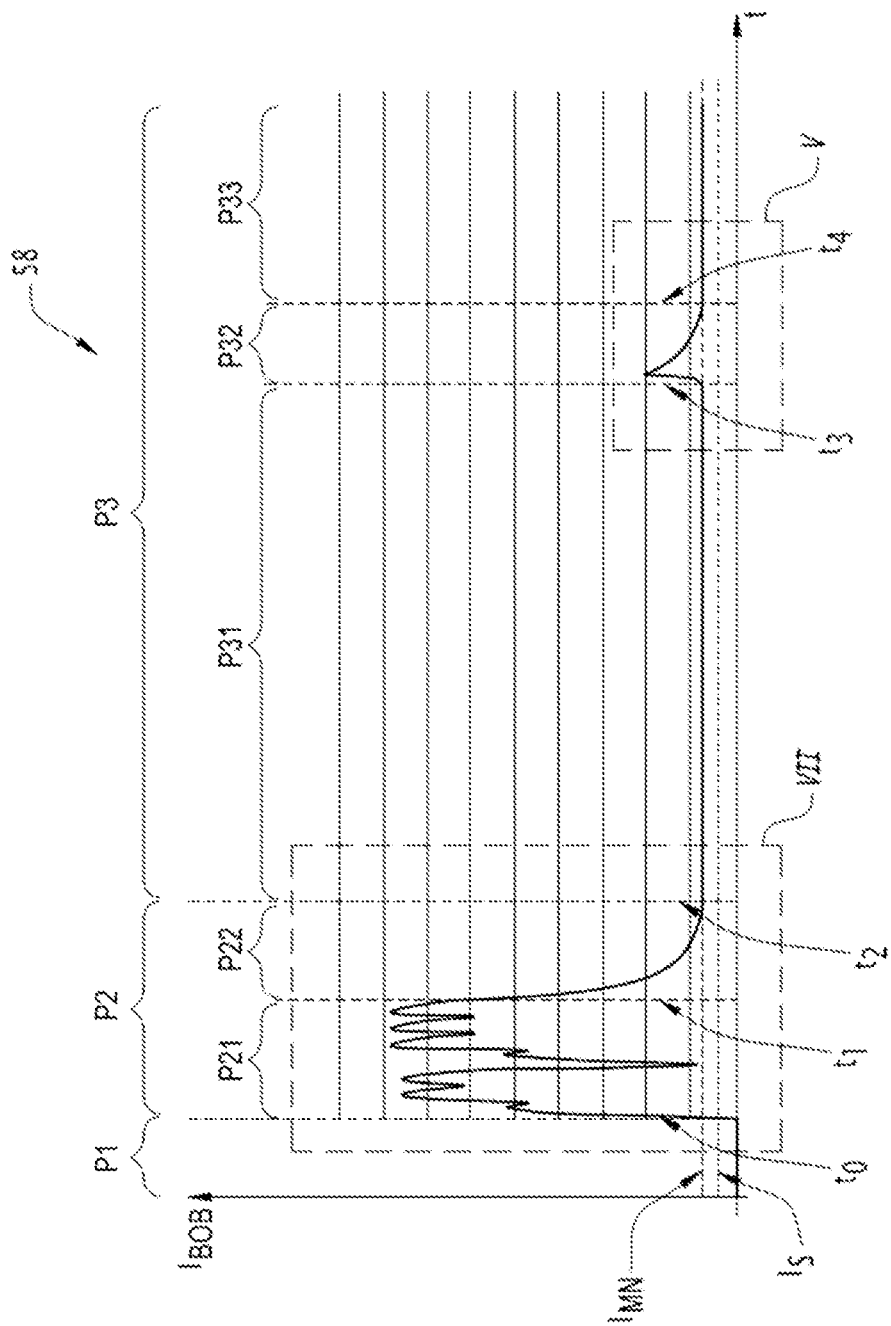
FIG. 3 is a graph showing the trend of an electrical control current of the electromagnetic actuator of FIG. 2 during several operating phases.

FIG. 3 shows a graph 58 illustrating the trend of the coil current $I_{BOB}$ circulating in the coil 32 over time t during different successive operating phases of the contactor 1, denoted P1, P2 and P3, in the case whereby the contactor is switched from the open state to the closed state.

Phase P1 is an initial phase, during which the contactor 1 is in the stable open state, i.e. the coil current $I_{BOB}$ does not exceed the drop-out current $I_D$. In the example of FIG. 3, the coil current $I_{BOB}$ remains zero during the initial phase P1.

Phase P2 corresponds to a closing phase, after a closing command has been received by the contactor 1. Phase P2 starts when the electronic control device 40 receives, at an instant $t_0$, a closing command from the interface 44.

The electronic control device 40 is set up to apply the control coil voltage $U_{BOB}$ to the terminals of the coil 32. For example, the control device 40 then commands the fallback switch T1 and the power supply switch T2, so as to regulate the coil voltage $U_{BOB}$ as a function of the voltage of the power supply rail 42.

In the illustrated example, the voltage of the rail 42 is alternative: it is understood that the coil 32 may not operate when connected directly to the power supply rail 42. In practice, with the fallback switch T1 closed, the control device 40 controls the closing and opening of the power supply switch T2, in other words it controls the switching of the power supply switch T2 in order to chop the voltage of the power supply rail 42, so that the coil voltage $U_{BOB}$ and the coil current $I_{BOB}$ are stable and adapted for operating the coil 32.

Many control methods exist, in particular by voltage chopping. Patent EP-2984671 B1 provides examples of these methods. In the illustrated example, the voltage chopping method is used.

The pilot control device 40 regulates the switching of the power supply switch T2 to a chopping frequency that is selected so as not to generate noise audible to humans, for example, a chopping frequency below 100 Hz or above 20 kHz. On the other hand, the higher the chopping frequency, the easier it is to regulate the coil current $I_{BOB}$. The chopping frequency generally ranges between 20 kHz and 100 kHz. In the illustrated example, the chopping frequency is stable and equal to 20 kHz.

During each chopping cycle, the power supply switch T2 is closed for a fraction of this chopping cycle, defining a duty cycle α. The duty cycle α is a parameter continuously varying between 0 and 1, including the limits 0 and 1. In other words, during the same chopping cycle, the power supply switch T2 is open for a fraction of the cycle equal to 1−α. The control device 40 thus determines the duty cycle α as a function of the difference between a setpoint and a measurement of the coil current $I_{BOB}$.

The closing phase P2 comprises a dynamic phase P21, during which the coil voltage $U_{BOB}$ is controlled by the electronic control device 40. In other words, the duty cycle α is not always zero, and the coil 32 is supplied with electrical energy originating from the power supply rail 42. The coil current $I_{BOB}$, which is initially zero, then increases to exceed the drop-out current $I_D$: from this point, the core 34 starts to move from its open position to its closed position. The core 34 then reaches a mechanical stop. During the dynamic phase P21, the coil current $I_{BOB}$ exhibits significant variations, in particular related to the self-induction phenomena of the coil 32, whereas the movable core 34 moves within the coil 32. At the end of the dynamic phase P21, the contactor 1 is in the stable closed state.

The dynamic phase P21 ends at an instant $t_1$ and is followed by a transition phase P22, during which the coil current $I_{BOB}$ is lowered to a holding current $I_{MN}$, with the holding current $I_{MN}$ being strictly greater than the stall current $I_S$, so that the contactor 1 always remains in the closed state. The transition phase P22 ends at an instant $t_2$. By way of an illustration, in the example of FIG. 3, the transition phase P22 lasts for approximately 40 ms.

During the transition phase P22, the power supply switch T2 is open, in other words the duty cycle α is zero, whereas the fallback switch T1 remains closed: the control circuit 51 is in a mode called "freewheeling" mode. In general, in freewheeling mode the coil 32 is not supplied with electrical energy by the power supply rail 42, and the coil voltage $U_{BOB}$ is imposed passively by the control circuit 51. In particular, the coil voltage $U_{BOB}$ is imposed by the electronic components of the control circuit 51. The coil current $I_{BOB}$ decreases freely, with the electrical energy being mainly dissipated by the coil resistance $R_{BOB}$.

In particular, in freewheeling mode, the coil voltage $U_{BOB}$ can be assessed without requiring a measurement. In the illustrated example, in freewheeling mode the coil voltage $U_{BOB}$ is imposed by a threshold voltage of the freewheeling diode Drl.

At the end of the transition phase P22, the coil current $I_{BOB}$ is equal to the holding current $I_{MN}$. To prevent the coil current $I_{BOB}$ from decreasing below the holding current $I_{MN}$, the control device 40 adjusts the duty cycle α to a non-zero value: the phase P3 then begins. Phase P3 corresponds to a holding phase, during which the coil current $I_{BOB}$ is kept above the stall current $I_S$.

The holding phase P3 in this case comprises a first stable portion P31, which starts at the instant $t_2$ and during which the coil current $I_{BOB}$ is stable, by virtue of the regulation of the control device 40. During the first portion P31, the duty cycle α is substantially constant. The first portion P31 is followed by a second portion P32, during which the coil current $I_{BOB}$ has a current spike, with an increasing portion, followed by a decreasing portion, during which the control circuit 51 is in the freewheeling mode. The second portion P32 corresponds to a test phase, which is described hereafter. The test phase P32 starts at an instant $t_3$, ends at an instant $t_4$ and is followed by a third portion P33, similar to the first stable portion P31, during which the coil current $I_{BOB}$ is stable.

The electrical and electromagnetic quantities of the coil 32 in the freewheeling mode of the switching apparatus 1 are now considered. During the freewheeling phase, the equation governing the relationship between the coil current and the coil voltage is:

$$U_{BOB} = R_{BOB} \cdot I_{BOB} + L_{BOB}\frac{dI_{BOB}}{dt}. \quad \text{[Math 1]}$$

Over a time interval $\Delta t$ that is short enough for the coil current $I_{BOB}$ to be considered to be constant, the equation Math 1 can be simplified to simply assess the coil inductance $L_{BOB}$ with an acceptable approximation error:

$$L_{BOB} = \frac{U_{BOB} - R_{BOB} \cdot I_{BOB}}{\Delta I_{BOB}/\Delta t}, \quad \text{[Math 2]}$$

where $U_{BOB}$ depends on the control circuit 51 and is assessed without a measurement, whereas $R_{BOB}$ is obtained beforehand, and preferably is recorded in the electronic control device 40. Thus, in freewheeling mode, only the measurement of the coil current $I_{BOB}$ is sufficient for assessing the coil inductance $L_{BOB}$, since the coil voltage $U_{BOB}$ and the coil resistance $R_{BOB}$ values are known beforehand. The coil resistance $R_{BOB}$ particularly depends on a coil temperature 32. Therefore, it is recommended that the coil resistance $R_{BOB}$ is assessed for the sake of the precision of the computation. When it is not possible to simply estimate the coil resistance $R_{BOB}$, a nominal value is selected for the coil resistance $R_{BOB}$, which corresponds to a value of the coil resistance $R_{BOB}$ at ambient temperature, for example, at 25° C. The nominal value of the coil resistance $R_{BOB}$ is, for example, measured when manufacturing the actuator 30, or even is a value provided in the specifications of the coil 32 manufacturer.

In practice, the duration of the time interval $\Delta t$ ranges between 0.01 ms and 10 ms, preferably between 0.1 ms and 1 ms, in particular equal to 0.2 ms.

In order to reduce the error associated with measurement uncertainties and/or noise, the computation of the coil inductance $L_{BOB}$ is repeated several times, over several successive time intervals $\Delta t$, during the same freewheeling phase. The time intervals $\Delta t$ are consecutive, for example. An average value, denoted $\overline{L}_{BOB}$, of the coil inductance $L_{BOB}$ during this freewheeling phase is then computed. In order to compute the average value $\overline{L}_{BOB}$, the value of the coil inductance $L_{BOB}$ is averaged over at least ten time intervals $\Delta t$, preferably over at least twenty time intervals $\Delta t$.

The electromagnetic actuator 30 comprises a magnetic circuit made of a material. In particular, the movable core 34 particularly forms part of the magnetic circuit of the electromagnetic actuator 30. When magnetic saturation of the material of the movable core 34 approaches the maximum saturation of this material, the magnetic permeability of this material approaches the magnetic permeability of air. Consequently, the degree of certainty concerning the distinction between the open state or the closed state of the electromagnetic actuator 30, as assessed from measurements of the coil inductance $L_{BOB}$, decreases.

The magnetic saturation of the material is a function of the magnetic field generated by the coil 32, in other words as a function of fixed design parameters, such as the geometry of the coil 32, the materials used, the number of turns N, etc., and as a function of the coil current $I_{BOB}$.

The coil inductance $L_{BOB}$ is advantageously computed from measurements of the coil current $I_{BOB}$ taken in an area of the coil current $I_{BOB}$ where the material of the magnetic circuit has magnetic saturation of less than 80% of the maximum magnetic saturation of this material, preferably less than 50%.

In the illustrated example, the magnetic core 34 is made of iron and has magnetic saturation of the order of 2 T—Tesla—. The measurements of coil inductance $L_{BOB}$ are thus taken for magnetic saturation of less than 1.6 T, preferably less than 1 T.

Figure 4:
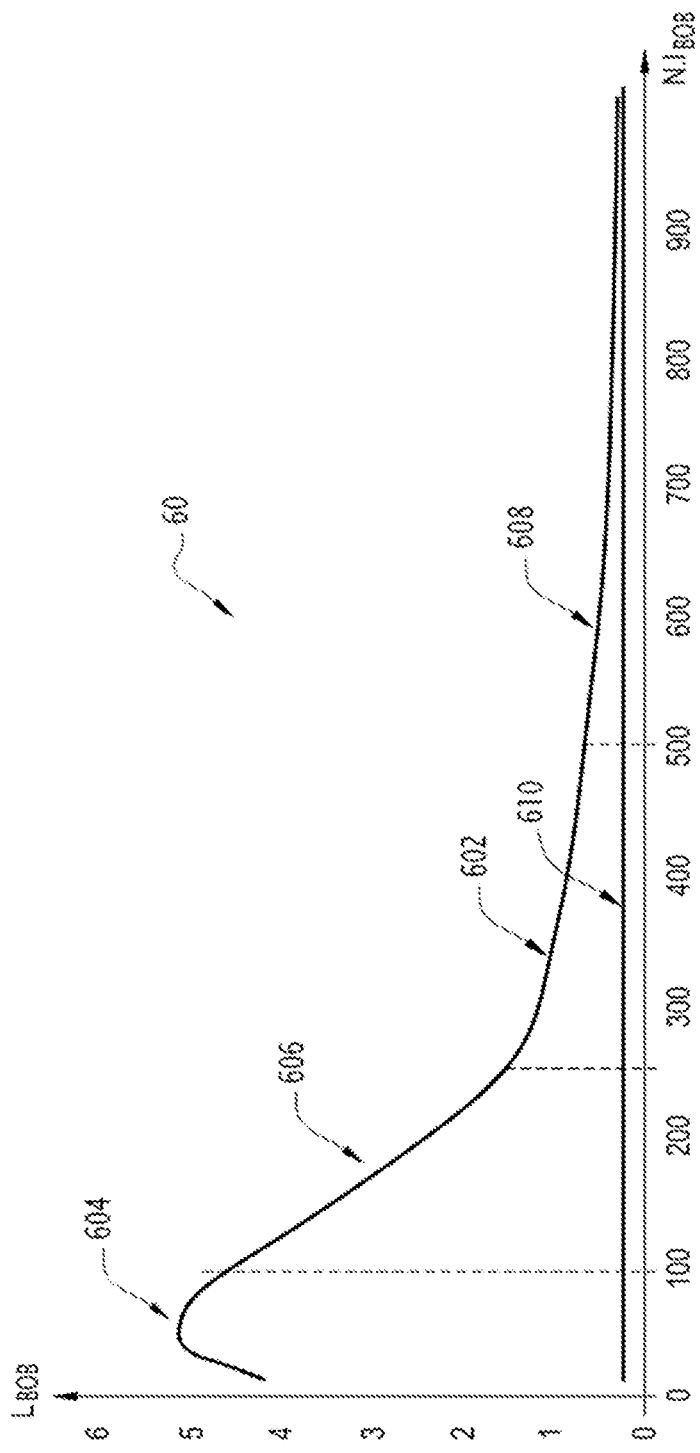
FIG. 4 is a graph showing the trend of electrical quantities of the electromagnetic actuator, according to whether the actuator is open or closed.

FIG. 4 shows a graph 60 illustrating this saturation phenomenon for a specific coil 32. The graph 60 illustrates, in freewheeling mode, the trend of the coil inductance $L_{BOB}$ of the coil 32, as a function of a number of Ampere-turns $N \times I_{BOB}$, equal to the product of the coil current $I_{BOB}$ multiplied by the number of turns N of the coil 32. The maximum value of Ampere-turns $N \times I_{BOB}$ represents the magnetic saturation of the coil 32. FIG. 4 illustrates the definition of a preferred area of implementation of the estimation method according to the invention; furthermore, the inductance measurements $L_{BOB}$ are taken in this case by means of a specific sensor, which is not necessary for the implementation of the invention.

A first curve 602 illustrates the trend of the coil inductance $L_{BOB}$ when the electromagnetic actuator 30 is open, in other words when the core 34 is in a stable open position. The curve 602 has a maximum 604 for a number of Ampere-turns $N \times I_{BOB}$ ranging between 0 and 100, followed by a decreasing portion 606 with a steep slope between 100 and 250, and then a decreasing portion 608 with a shallower slope beyond 250.

A second curve 610 illustrates a measurement of the coil inductance $L_{BOB}$ when the electromagnetic actuator 30 is closed, in other words when the core 34 is in a stable closed position. The curve 610 is substantially constant, irrespective of the number of Ampere-turns $N \times I_{BOB}$.

When the number of Ampere-turns $N \times I_{BOB}$ increases beyond 500, the curves 602 and 610 are relatively close to each other and tend towards the same value. In view of measurement inaccuracies, an assessment of the coil inductance $L_{BOB}$ cannot distinguish, with sufficient confidence, whether the electromagnetic actuator 30 is in the open or closed state. In other words, excessive saturation of the magnetic circuit of the actuator 30 is detrimental to the differentiation of the open or closed states of the electromagnetic actuator 30.

In the present case of an electromagnetic actuator 30 with a linear structure with variable reluctance, when the magnetic circuit is only slightly saturated, a significant differentiation of the coil inductance $L_{BOB}$ is noted between the open and closed positions of the core 34. In practice, the coil inductance $L_{BOB}$ is computed from measured coil current values, for which the value of a number of Ampere-turns $N \times I_{BOB}$, equal to the product of the coil current multiplied by the number of turns N of the coil 32, is less than 500.

When the number of Ampere-turns $N \times I_{BOB}$ is less than 500, the curves 602 and 604 are well separated, in other words an assessment of the coil inductance $L_{BOB}$ can distinguish, with sufficient confidence, whether the electromagnetic actuator 30 is in the open or closed state. The confidence is even higher when the number of Ampere-turns $N \times I_{BOB}$ is less than 250 or even less than 100.

Figure 5:
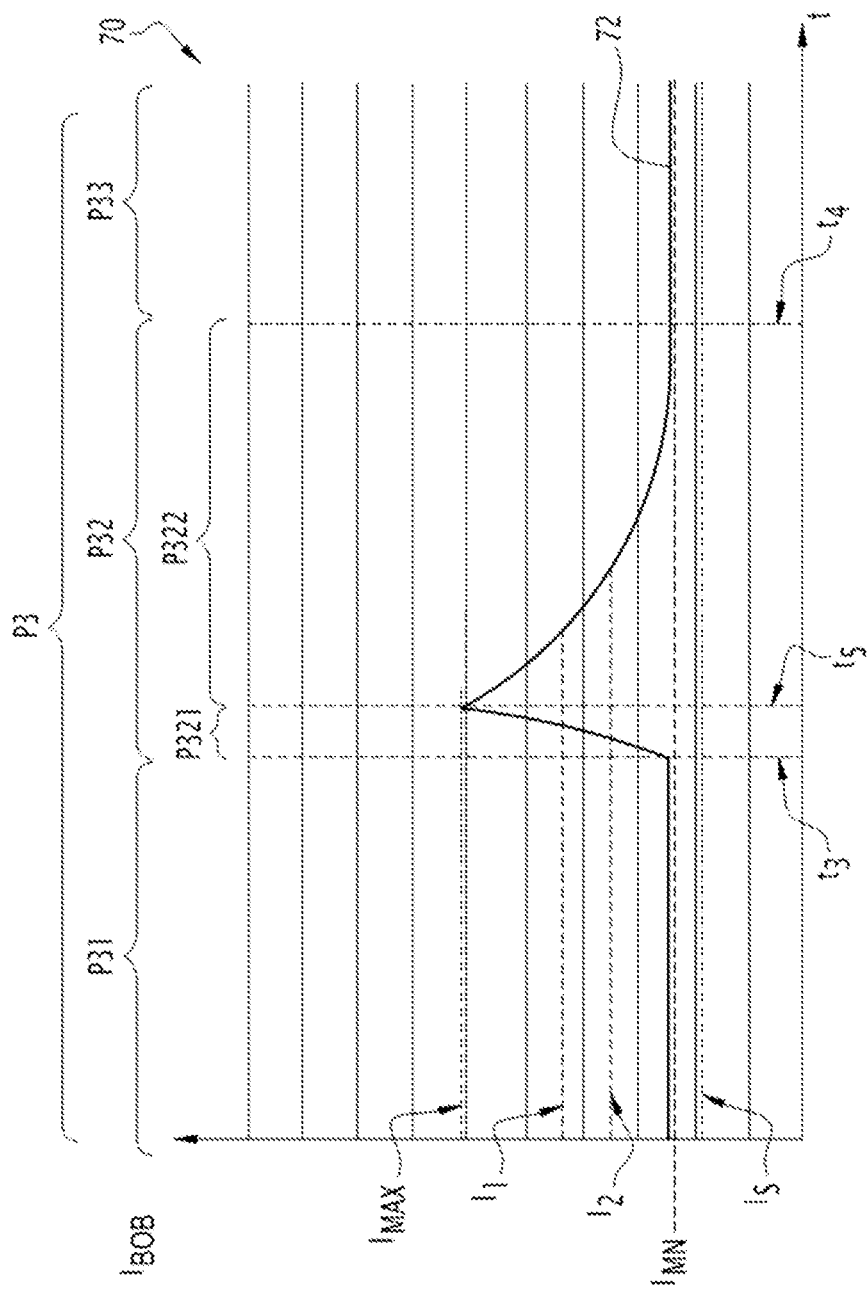
FIG. 5 is a graph showing the detail V in FIG. 3, during a holding phase of the electromagnetic actuator.

FIG. 5 shows a graph 70 illustrating the implementation of the method described above during the holding phase P3, more specifically during the test phase P32. In FIG. 5, a curve 72 represents the trend of the coil current $I_{BOB}$ over time.

During the holding phase P31, the control device 40 adjusts the duty cycle $\alpha$ so that the coil current $I_{BOB}$ is equal to the holding current $I_{MN}$. The duty cycle $\alpha$ is generally constant, and equal to a holding value $\alpha_{MN}$. The coil current $U_{BOB}$ for its part is also constant.

At the instant $t_3$, the control device 40 adjusts the duty cycle α so that the coil current $I_{BOB}$ increases to a maximum value, denoted IMAX, which is reached at an instant $t_5$. The instants $t_3$ and $t_5$ thus delimit an increasing portion P321 of the coil current $I_{BOB}$. The closer the duty cycle α is to 1, the faster the coil current $I_{BOB}$ increases from $I_{MN}$ to IMAX between the instants $t_3$ and $t_5$. The closer the duty cycle α is to $α_{MN}$, while being strictly greater than $α_{MN}$, the more slowly the $I_{BOB}$ coil current increases over the increasing portion P321.

From the instant $t_5$, the control device 40 places the control device 30 in freewheeling mode, i.e. the power supply switch T2 remains open, with the duty cycle α being equal to zero. The coil current $I_{BOB}$ decreases freely, until the coil current $I_{BOB}$ reaches, at the instant ta, the holding current $I_{MN}$: the instants $t_5$ and $t_4$ therefore delimit a decreasing portion P322 of the test phase P32, during which the actuator 30 is in freewheeling mode.

The third portion P33 starts from the instant ta, with the control device 40 again adjusting the duty cycle α to the holding value $α_{MN}$, so that the coil current $I_{BOB}$ remains stable and equal to the holding current $I_{MN}$. In other words, the spike of the coil current $I_{BOB}$ of the test phase P32 is applied using the electronic control device 40 during the holding phase P3 of the contactor 1.

During the decreasing portion P322, the coil inductance $L_{BOB}$ is measured between a first limit $I_1$ and a second limit $I_2$ of the coil current $I_{BOB}$, strictly lower than the first limit $I_t$ with the first limit $I_1$ and the second limit $I_2$ ranging between the maximum current IMAX and the holding current $I_{MN}$. The first limit $I_1$ and the second limit I2 are selected to reduce transient effects as much as possible, but also to ensure that the magnetic saturation of the core 34 remains below 80% of the maximum magnetic saturation of this core 34. In the illustrated example, the first limit $I_1$ in this case has a median value between the holding current $I_{MN}$ and the maximum current IMAX of the test phase P32, whereas the second limit $I_2$ in this case has a median value between the holding current $I_{MN}$ and the first limit $I_1$ of the coil current $I_{BOB}$. In other words, in the illustrated example, $I_1=1.5×I_{MN}$, and $I_2=1.25×I_{MN}$.

The maximum value IMAX is advantageously selected so that the decreasing portion P322 lasts long enough to compute the coil inductance $L_{BOB}$ according to the previously described method based on the equation Math 2. As previously mentioned, several successive measurements of the coil current $I_{BOB}$ are taken, so as to compute the average value $\overline{L}_{BOB}$ of the coil inductance $L_{BOB}$. The duration of the decreasing portion P322 in this case ranges between 35 ms and 40 ms, and the maximum value $I_{MAX}$ of the coil current $I_{BOB}$ in this case is selected as being twice the holding current $I_{MN}$, in other words $I_{MAX}=2×I_{MN}$. During the increasing phase P321, the duty cycle α is selected so that the duration of the increasing phase P321 ranges between 3 ms and 10 ms, for example, equal to 5 ms. Of course, other values of $I_{MAX}$ and of duty cycle α can be selected, as required, to adjust the durations of the increasing P321 or decreasing P322 portions.

In the computation of the coil inductance $L_{BOB}$, the coil resistance $R_{BOB}$ is previously known. By default, the value of the coil resistance $R_{BOB}$ is equal to the nominal value of the coil resistance $R_{BOB}$.

When the coil inductance $L_{BOB}$ is computed during a test phase P32, this test phase P32 is preceded by a stable phase P31, during which the coil current $I_{BOB}$ is constant and equal to the holding current $I_{MN}$. Since the terms deduced from the equation Math 1 are zero, the coil resistance $R_{BOB}$ is advantageously deduced by the following simple Ohm's law relation:

$$R_{BOB} = \frac{U_{BOB}}{I_{BOB}}.$$

In order to minimize errors associated with the measurement noise of the coil current $I_{BOB}$ and the coil voltage $U_{BOB}$, the coil resistance $R_{BOB}$ is computed several times over a time interval included in the stable portion P31, and the results of these coil resistance $R_{BOB}$ computations are averaged in order to obtain a precise value of the coil resistance $R_{BOB}$. For example, ten successive computations of the coil resistance $R_{BOB}$ are performed over an interval of 10 ms, in order to compute an average value of the coil resistance $R_{BOB}$.

This average value enables more precise computation of the coil inductance $L_{BOB}$, and indirectly allows a better estimate of the position of the core 34 of the actuator 30 to be provided. The precise knowledge of the coil resistance $R_{BOB}$ can also be used to estimate the temperature of the coil 32.

Figure 6:
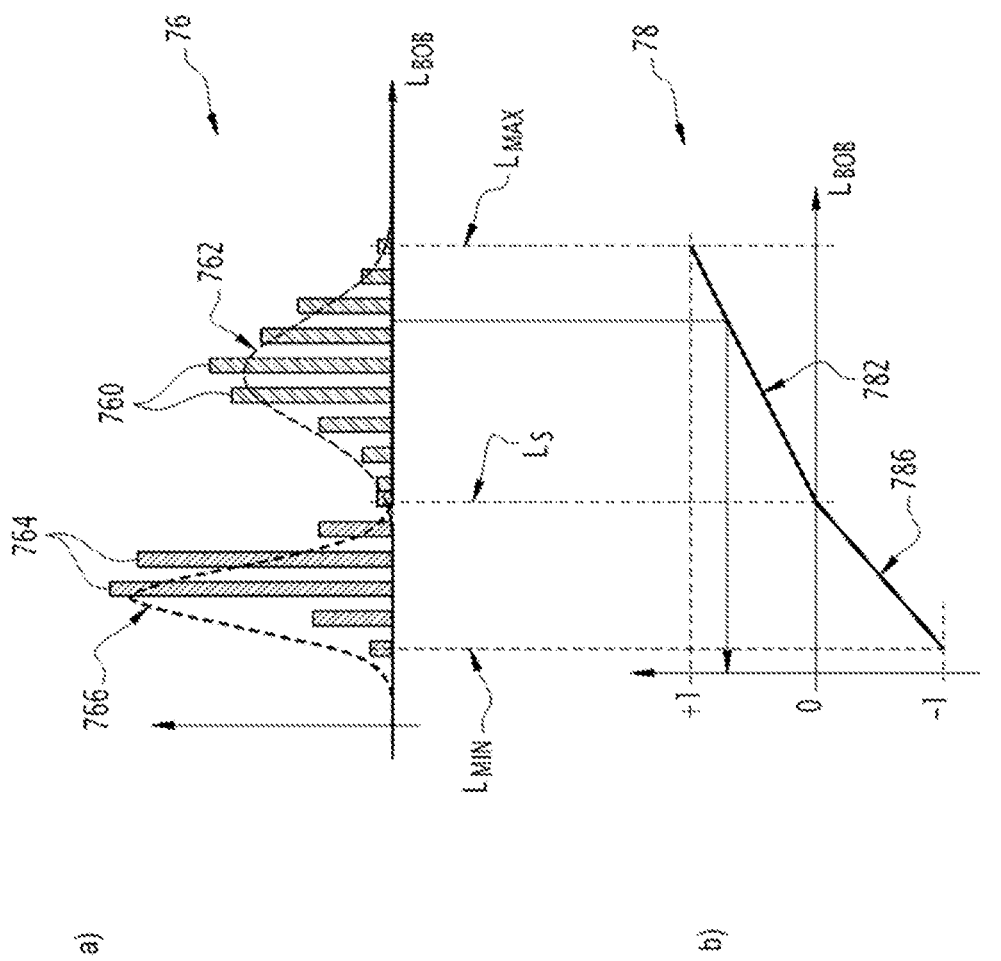
FIG. 6 shows, in two inserts a) and b), an example of a method for normalizing electrical quantities of the electromagnetic actuator of FIG. 2, according to whether the actuator is open or closed.

FIG. 6 shows, in insert a), a graph 76 illustrating the statistical distribution of the value of the coil inductance $L_{BOB}$ of the actuator 30, depending on whether the actuator 30 is open or closed. The coil inductance $L_{BOB}$ in this case is computed by numerical simulation of the actuator 30.

Numerous numerical simulation methods exist. Advantageously, the critical parameters of the simulated system are identified by experimental design, with the respective ranges of variation of these critical parameters being identified and combined. By way of non-limiting examples, the critical parameters can include one or more parameters from among the geometrical parameters of the ferromagnetic elements and of the winding of the electromagnetic actuator 1, the physical parameters of the materials used, the tolerances on the electronic components involved in the control or measurement, etc.

A first histogram 760 corresponds to the coil inductance values $L_{BOB}$ computed from measurements of the coil current $I_{BOB}$ taken when the actuator 30 is in the open state. A first distribution function 762 is deduced from the first histogram 760. In the illustrated example, the first distribution function 762 has a Gaussian shape and is located on the right-hand side of the graph 76.

A second histogram 764 corresponds to the coil inductance values $L_{BOB}$ computed from measurements of the coil current $I_{BOB}$ taken when the actuator 30 is in the closed state. A second distribution function 766 is deduced from the second histogram 764. In the example, the second distribution function 766 also has a Gaussian shape and is located on the left-hand side of the graph 76.

It should be noted that the two distribution functions 762 and 766 are quite distinct, in particular by virtue of the fact that the magnetic saturation of the material of the core 34 is kept below 80% of the maximum magnetic saturation of this material. In practice, in the illustrated example, the number of Ampere-turns $N×I_{BOB}$ is less than 500. It is therefore possible, from a computation of the coil inductance $L_{BOB}$, to determine, with high probability, whether the electromagnetic actuator 30 is in the open or closed state. In other words, the coil inductance $L_{BOB}$ is a reliable indicator of the state of the electromagnetic actuator 30.

A threshold value of the coil inductance $L_{BOB}$ is called Ls, which allows the two distribution functions 762 and 766 to be differentiated. Thus, the first function 762 groups values extending between the threshold value Ls and a maximum value $L_{MAX}$, whereas the second function 766 groups values extending between a minimum value $L_{MIN}$ and the threshold value Ls.

The coil inductance value $L_{BOB}$ is advantageously normalized so that the indicator is easier to use, so that as a result of the normalization, the indicator of the state of the contactor is equal to −1 when the value of the coil inductance $L_{BOB}$ is equal to the minimum value $L_{MIN}$, +1 when the value of the coil inductance $L_{BOB}$ is equal to the maximum value $L_{MAX}$, and 0 when the value of the coil inductance $L_{BOB}$ is equal to the threshold value $L_S$.

Several normalization functions exist; in this case, a normalization by affine functions is selected, as it is particularly easy to use and yields good results.

FIG. 6 shows, in insert b), a graph 78 showing two affine normalization functions, applied in this case to the coil inductance $L_{BOB}$.

A first portion 782 yields a value 0 when the coil inductance $L_{BOB}$ is equal to the threshold value $L_S$, and yields a value +1 when the coil inductance $L_{BOB}$ is equal to the maximum value $L_{MAX}$.

A second portion 786 yields a value −1 when the coil inductance $L_{BOB}$ is equal to the minimum value $L_{MIN}$, and yields a value 0 when the coil inductance $L_{BOB}$ is equal to the threshold value $L_S$.

Thus, for each computed value of the coil inductance $L_{BOB}$, as input for the normalization function, a single output value of the normalized coil inductance $L_{BOB}$ is obtained.

In general, when several indicators of the state of the electromagnetic actuator 30 are available, these indicators are advantageously combined together, to arrive at an even more reliable overall indicator of the state of the electromagnetic actuator 30. Of course, the indicators combined together are normalized to indicate the same value when the contactor 1 is in a given state.

In the present case, in addition to the value of the coil inductance $L_{BOB}$ that results in a first indicator, one or more other electrical quantities of the contactor 1 are measured, with each other electrical quantity measurement also being normalized, to arrive at an overall indicator of the state of the switching apparatus.

Schematically, a minimum and a maximum value of this electrical quantity in the various operating states of the contactor 1 and a threshold value for differentiating the states of the contactor 1 are determined for each further measurement of an electrical quantity. This results in two affine functions, which allow the computed values for each electrical quantity to be normalized between −1 and +1.

Depending on the requirements, the operator is free to contemplate combining two, three or even more normalized electrical quantities to form a reliable overall indicator.

An overall indicator formed from two standardized electrical quantities thus varies between −2 and +2. A value close to −2 or +2 allows the state of the contactor 1 to be identified with a high degree of certainty, whereas a value close to 0 indicates that the two normalized electrical quantities provide conflicting results, potentially indicating an operating anomaly of the contactor 1.

An overall indicator formed from three normalized electrical quantities thus varies between −3 and +3. For example, a value ranging between −3 and −1, or even between +1 and +3, allows the state of the contactor 1 to be identified with a high degree of certainty, whereas a value ranging between −1 and +1 indicates an operating anomaly.

A second example of an electrical quantity is a magnetic flux ϕ of the coil 32, which is computed from measurements taken during the test phase P32. In general, when the coil current $I_{BOB}$ circulates through the coil 32, a magnetic flux ϕ is generated. The value of the magnetic flux ϕ particularly depends on the value of the coil current $I_{BOB}$ and the position of the movable core 34.

For example, the value of the magnetic flux ϕ is linked to the values of the coil voltage $U_{BOB}$ and of the coil current $I_{BOB}$ according to the following equation, denoted Math 3 hereafter:

$$U_{BOB} = R_{BOB} \cdot I_{BOB} + N\frac{d\phi}{dt}, \quad [\text{Math 3}]$$

where N is the number of turns of the coil 32, and ϕ is the magnetic flux resulting from the magnetic field created in the coil 32.

A position x is defined as a position of the core 34 relative to the coil 32. In many embodiments, the core 34 can move translationally relative to the coil 32 along an axis of movement. The position x is then defined along this axis of movement. By convention, the position x is zero when the contactor 1 is in the open state. For each of the electrical phases of the contactor 1, the position of the movable contacts 24 is thus linked to the position X. By extension, the position x also represents a position of the electromagnetic actuator 30 or of the contactor 1.

By deriving ϕ in the equation Math 3, a general equation Math 4 governing the electromagnetic quantities in the actuator 30 is obtained:

$$U_{BOB} = R_{BOB} \cdot I_{BOB} + N\frac{d\phi}{dI_{BOB}}\frac{dI_{BOB}}{dt} + N\frac{d\phi}{dx}\frac{dx}{dt} + N\frac{d\phi}{di_f}\frac{di_f}{dt}, \quad [\text{Math 4}]$$

where the last term $$N\frac{d\phi}{di_f}\frac{di_f}{dt}$$

involves induction currents, also called eddy currents, denoted $i_f$, where N denotes the number of turns of the coil 34.

With the induced currents being neglected, the magnetic circuit has a reluctance Rel, which is, on the one hand, a function of the position x of the movable core 34 and of the coil current $I_{BOB}$, and which is, on the other hand, linked to the magnetic flux ϕ and to the coil current $I_{BOB}$ by the following relationship, called Hopkinson relationship: Rel (x, $I_{BGB}$)·ϕ=N·$I_{BOB}$.

As the reluctance Rel varies with the position x of the actuator 30, it is possible to determine an image of this position x through the ratio $\Delta I_{BOB}(t)/\Delta\phi(t)$, with N being constant.

During the test phase P32, the position x is stabilized, whereas $I_{BOB}$, and therefore the magnetic flux ϕ, varies. Thus, the following can be expressed: Rel(x, $I_{BGB}$)·Δϕ(t) =N·$\Delta I_{BOB}$(t).

Over a constant and pre-determined interval $\Delta I_{BOB}$, the variation of the magnetic flux Δϕ is therefore the image of the position x of the core 34. In other words, computing the magnetic flux ϕ allows an image of the position x to be determined during an increasing or decreasing phase of the coil current $I_{BOB}$. The equation Math 3 becomes, by temporal integration during the test phase P32:

$$\phi = \int \frac{U_{BOB} - R_{BOB} \cdot I_{BOB}}{N_{BOB}} dt, \quad \text{[Math 5]}$$

where the coil current $I_{BOB}$ is measured, the coil resistance $R_{BOB}$ and the number of turns $N_{BOB}$ are previously known, and the coil voltage $U_{BOB}$ is assessed. In particular, the coil voltage $U_{BOB}$ is controlled by the electronic control device 40, which acts on the duty cycle α. The coil voltage $U_{BOB}$ is provided by the following relationship:

$$U_{BOB} = \alpha \cdot (V_{rect} - V_{loss_{ON}}) + (1-\alpha) \cdot (V_{loss_{OFF}}),$$

where Vrect is the voltage of the power supply rail 42, and $Vloss_{ON}$ and $Vloss_{OFF}$ are respectively the cumulative voltage drops of all the in-series components of the coil 32, placed between the power supply rail 42 and the coil 32, when the power supply switch T2 is respectively closed or open. The voltage drops $Vloss_{ON}$ and $Vloss_{OFF}$ particularly depend on the electronic components and the architecture of the control circuit 51. Thus, the coil voltage $U_{BOB}$ is assessed without direct measurement, but simply from the duty cycle α, which is known because it is controlled by the electronic control device 40, and from the components of the control circuit 51 and the voltage Vrect of the power supply rail 42.

During the increasing portion P321, the duty cycle α is non-zero, and the coil current $I_{BOB}$ is increasing. Through temporal integration of the equation Math 4 between the instants $t_3$ and $t_5$, a first value of a magnetic flux, denoted $\Delta\phi_{UP}$—Delta Phi Up—is obtained. The coil current $I_{BOB}$ increases from the holding current $I_{MN}$ to the maximum current $I_{MAX}$.

During the decreasing portion P322, the duty cycle α is zero, and the coil current $I_{BOB}$ is decreasing. Through temporal integration of the equation Math 4 between the instants $t_5$ and $t_4$, a second value of a magnetic flux is obtained, denoted $\Delta\phi_{DOWN}$—Delta Phi Down—. The coil current $I_{BOB}$ decreases from the maximum current $I_{MAX}$ to the holding current $I_{MN}$.

The two computed values of magnetic flux $\Delta\phi_{UP}$ and $\Delta\phi_{DOWN}$ are then compared to a normalized interval, allowing a dependable and reliable indicator to be obtained of the state of the actuator 30. Depending on the cases, the two magnetic flux values $\Delta\phi_{UP}$ and $\Delta\phi_{DOWN}$ are used separately, or even in combination. As the voltage $U_{BOB}$ is different during the increasing P321 or decreasing P322 phases, it is thus possible to mitigate possible errors linked to the estimation of the coil voltage $U_{BOB}$.

Figure 7:
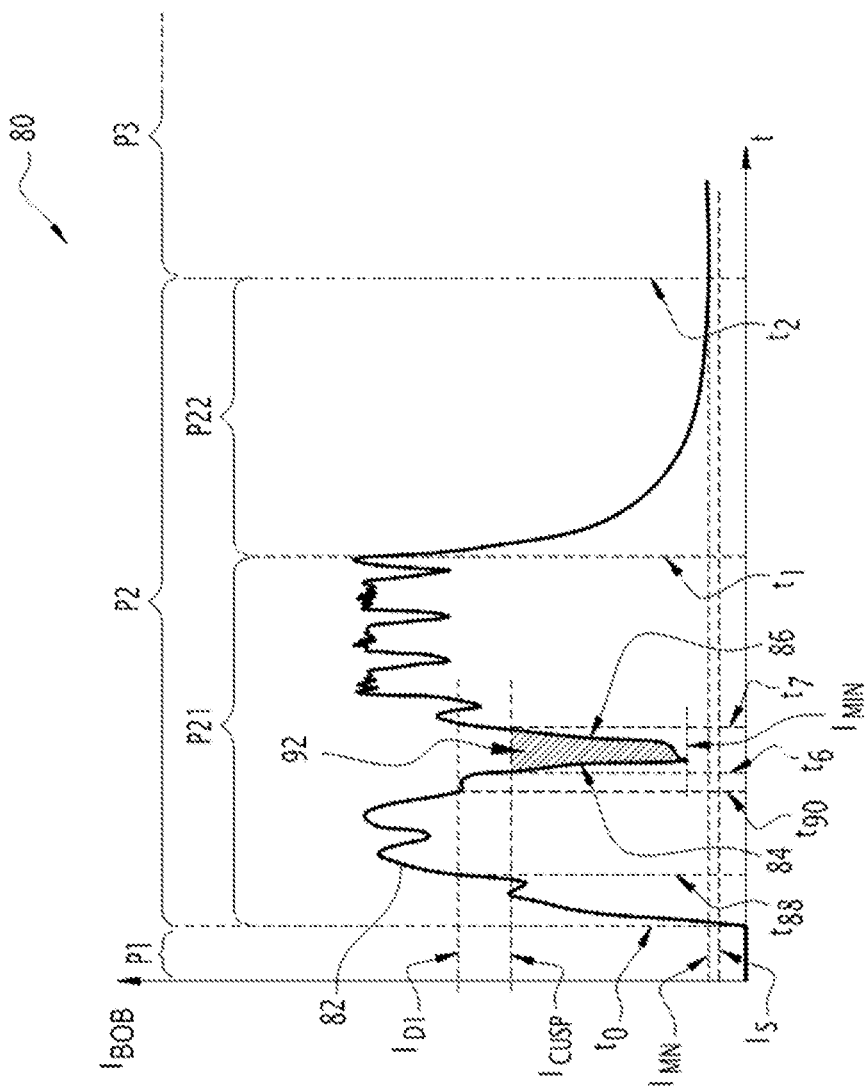
FIG. 7 is a graph showing the detail VII in FIG. 3, during a closing phase of the electromagnetic actuator.

A third example of measurement of an electrical quantity is described, with reference to FIG. 7, which represents a graph 80 with a curve 82 illustrating the trend of the coil current $I_{BOB}$ during a closing phase P2 of the contactor 1.

In actuator structures 30 with variable reluctance, the electromotive force associated with the variation of magnetic flux ϕ, which itself is associated with the variation in the position x of the core 34, induces a variation in the coil voltage $I_{BOB}$ as the movable part of the actuator 30 moves. This phenomenon corresponds to the term $$N \frac{d\phi}{dx} \frac{dx}{dt}$$

or me equation Math 4: in the closing phase, this is expressed as a drop in the coil voltage $U_{BOB}$ caused by the appearance of an electromotive force, which is a function of the speed of variation of the magnetic flux ϕ, and therefore of the speed of movement. The coil current $I_{BOB}$ also drops, and there is a link between this drop in coil current $I_{BOB}$ and the position of the movable part of the actuator 30, in other words the position x of the core 34.

In other words, the movement of the core 34 is expressed by a drop in the coil current $I_{BOB}$, which corresponds to a decreasing portion 84 of the curve 82. When the core 34 comes into abutment in the closed position, the coil current $I_{BOB}$ rises again, under the influence of the coil voltage $U_{BOB}$ controlled by the electronic control device 40. The rise of the coil current $I_{BOB}$ corresponds to an increasing portion 86 of the curve 82, which follows the decreasing portion 84. The coil current $I_{BOB}$ reaches a minimum value IMIN between the decreasing 84 and increasing 86 phases.

During the closing phase, the movement of the core 34 starts when the coil current $I_{BOB}$ exceeds a first current threshold $I_{D1}$ at an instant $t_{88}$ in FIG. 7. In the example, the first threshold $I_{D1}$ is linked to the drop-out current $I_D$, for example, equal to 90% of the drop-out current $I_D$. As the core 34 moves, the coil inductance $L_{BOB}$ increases, generating an increasing electromagnetic force on the core: the drop in coil current $I_{BOB}$ therefore does not result in the core 34 returning to its open position. Under the effect of the phenomena described above, the coil current $I_{BOB}$ decreases below the first current threshold $I_{D1}$ at an instant $t_{90}$, reaches the minimum value $I_{MIN}$, then increases again, and exceeds the first threshold $I_{D1}$ a second time.

A second threshold $I_{CUSP}$ is defined as being a value of the coil current $I_{BOB}$ strictly ranging between the first threshold $I_{D1}$ and the minimum current $I_{MIN}$. For example, the second threshold $I_{CUSP}$ is equal to 80% of the first threshold lot During the decreasing portion 84, the trend of the coil current $I_{BOB}$ decreases below the second threshold $I_{CUSP}$ at an instant $t_6$, whereas during the increasing portion 86, the trend of the coil current $I_{BOB}$ returns above the second threshold $I_{CUSP}$ at an instant $t_7$.

At the second threshold $I_{CUSP}$, the decreasing 84 and increasing 86 portions delimit an area 92, which is shaded in FIG. 7. A surface of the zone 92 is therefore equal to the integral, over a time interval defined between the instants $t_6$ and $t_7$, of the difference between the coil current $I_{BOB}$ and the current threshold $I_{CUSP}$, when the coil current $I_{BOB}$ is lower than the current threshold $I_{CUSP}$.

As described above, the faster the closure, which indicates good operation of the actuator 30, the more direct the reduction in coil current $I_{BOB}$, which results in a larger zone 92. In other words, provided that the trend of the coil current $I_{BOB}$ exceeds the first threshold $I_{D1}$ for a second time, the surface of the zone 92 is an indicator of the proper operation of the actuator 30: the result of the computation of the surface of the zone 92 is then normalized according to the previously described method, so as to obtain a reliable indicator of the proper closure of the actuator 30 during the closing phase P2.

A fourth example of a measurement of an electrical quantity is the computation of the coil inductance $L_{BOB}$, using the equation Math 2, during the transition phase P22, which is also a freewheeling phase, during which the core 34 is stable.

More generally, it is understood that many combinations of normalized indicators from measurements and/or computations of electrical quantities are possible, as different electrical quantities can be measured during the various operating phases of the actuator 30. The measurements of these electrical quantities can be simultaneous, or even staggered over time and recorded in the electronic control device 40.

Advantageously, the overall indicator is formed by a sum of its normalized indicators, i.e. each normalized indicator has the same weighting as the others. As an alternative embodiment, the normalized indicators have different weights.

Figure 8:
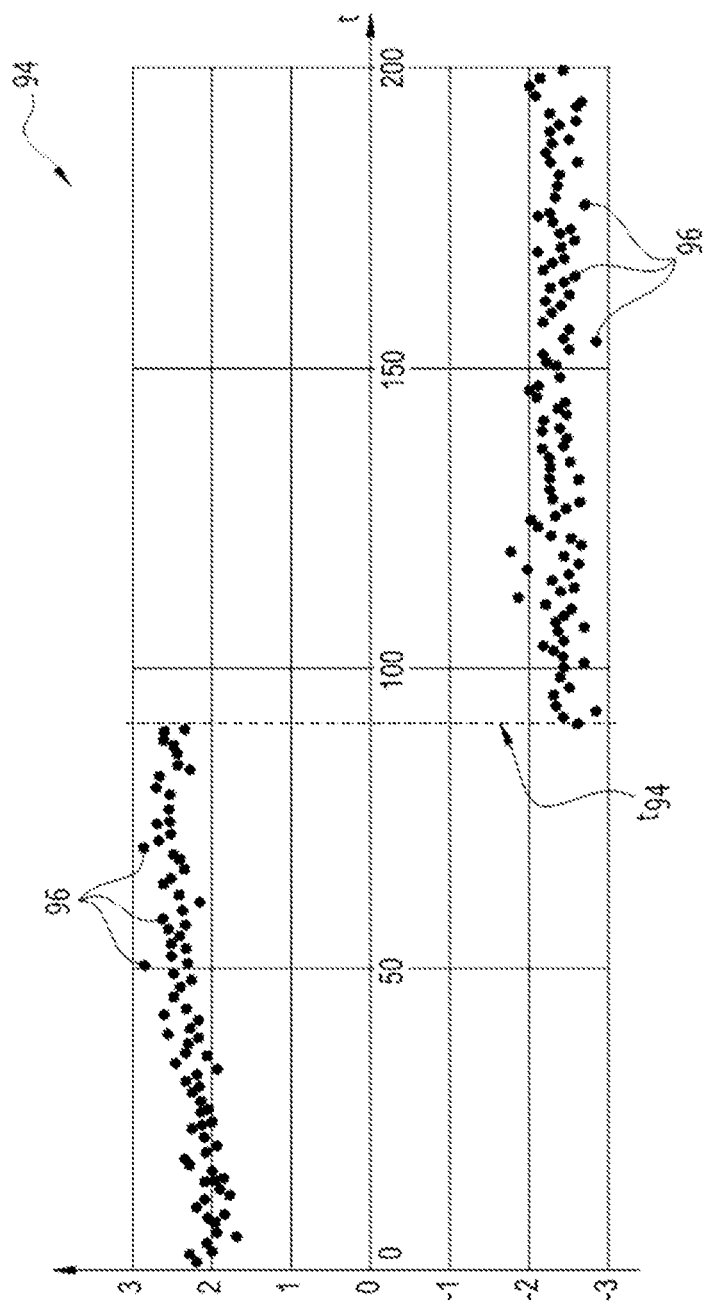
FIG. 8 is a graph showing an example of an indicator of the state of the electromagnetic actuator, with the indicator using the normalization method of FIG. 6.

FIG. 8 shows a graph 94 illustrating the results of two hundred computations of an overall indicator formed from measurements of three electrical quantities, which are then normalized and summed. The overall indicator therefore varies in this case between −3 and +3. In this example, the three considered electrical quantities are the coil inductance $L_{BOB}$, and the magnetic flux values $\Delta\phi_{UP}$ and $\Delta\phi_{DOWN}$. The critical parameters influencing these three electrical quantities, as well as the respective ranges of variation of these parameters, are defined through an experimental design. The computations of these three electrical quantities are carried out by varying all the critical parameters over all their respective ranges of variation.

The results are presented in the form of a scatter plot. A first scatter plot 96, on the left of the graph 94, corresponds to the results of the computations when the actuator 30 is in the closed position, whereas a second scatter plot 98, on the right of the graph 94, corresponds to the case whereby the actuator 30 is in the open position. The scatter plot 96 substantially changes between 2 and 2.5, which indicates that, while each critical parameter changes over its respective range of variation, the overall indicator results in a relatively stable, and therefore reliable, value. In other words, despite the variations of all the considered critical parameters, the three measurements of normalized electrical quantities indicate, in a concordant manner, that the switching apparatus 1 is closed. If one of the normalized indicators was inconsistent, for example, equal to −0.5, then the overall indicator would be, at most, equal to 2−0.5=1.5. Such an intermediate value would indicate a potential malfunction of the switching apparatus 1.

Similarly, the scatter plot 98 substantially changes between −2 and −2.5. Here again, the three normalized electrical quantities concordantly indicate that the switching apparatus 1 is open.

The clear distinction between the two scatter plots 96 and 98, respectively corresponding to the closed and open states of the actuator 30, indicates the reliability of the overall indicator described in this example.

Once an overall indicator of the state of the actuator 30 is reliably defined, it is still possible to combine the result of this indicator with other complementary values, representing the operation of the switching apparatus 1, in order to proceed with a diagnosis of the operation of the switching apparatus 1.

A first example of a complementary quantity is the detection of a pole current, circulating in each of the phases of the upstream line 20 of the contactor 1. Such a detection is carried out, for example, with the assistance of the current sensors 46: the passage of a pole current through a pole of the electrical conductor indicates the closed state of the contactor 1. By way of an illustration, if a pole current is detected while the overall indicator of the state of the actuator 30 indicates that the actuator 30 is open, then the inconsistency of the two results indicates an operating anomaly of the switching apparatus 1.

Optionally, the quantity relating to the detection of a pole current is normalized in order to be integrated in the previously described overall indicator. For example, when the current sensors 46 detect a pole current, the associated normalized indicator is equal to +1, whereas when the sensors 46 do not detect any pole current, the associated normalized indicator is equal to −1.

A second example of a measurement of a complementary quantity is a control state of the electronic control device 40.

Here again, optionally, this second complementary quantity can be normalized in order to be integrated in the previously described overall indicator. For example, when the control device 40 sends a closed state command, the associated normalized indicator is equal to +1, whereas when the control device 40 sends an open state command, the associated normalized indicator is equal to −1.

Figure 9:
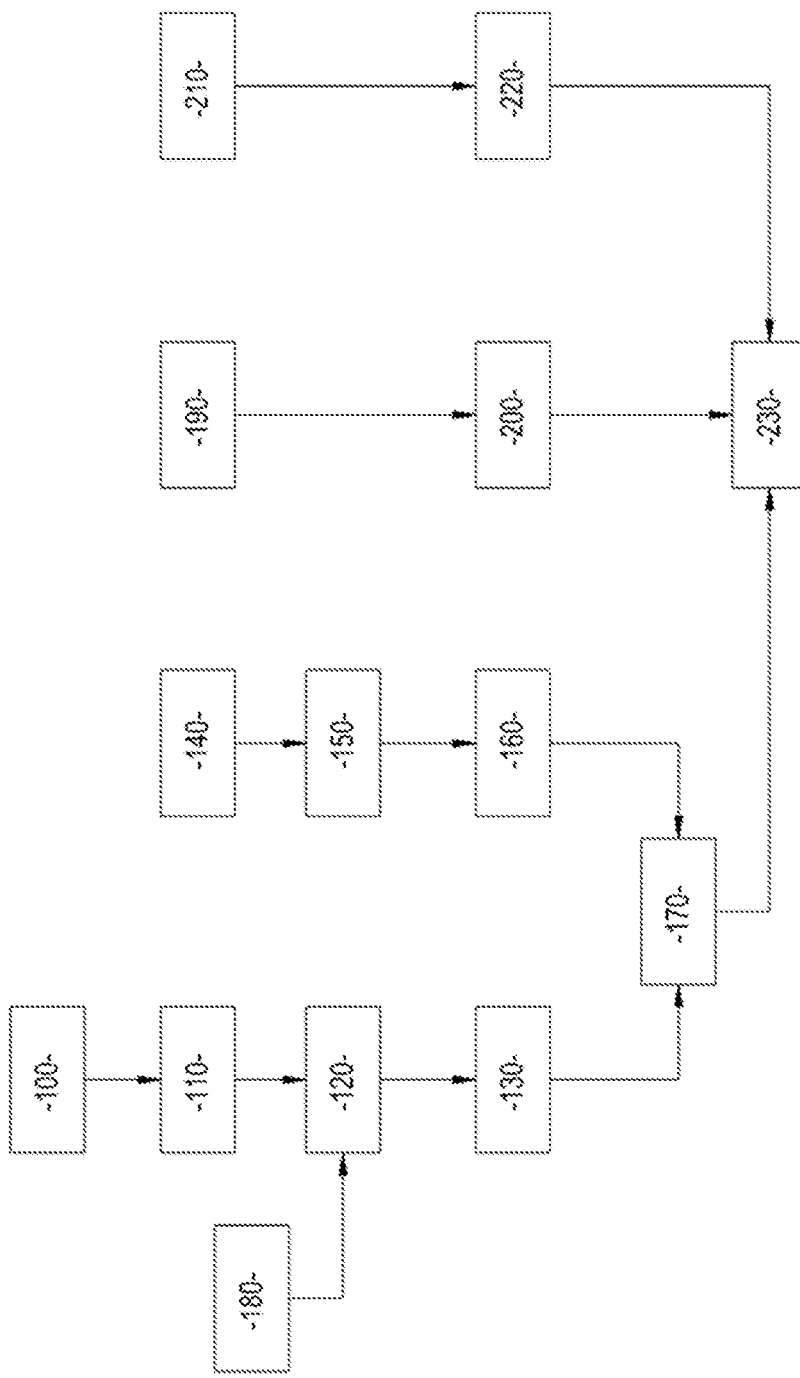
FIG. 9 is a diagram showing the steps of a method for estimating a state of the switching apparatus of FIG. 1, in accordance with embodiments of the invention.

An example of the operation of a method for estimating properties of the contactor 1 according to a preferred embodiment will now be described with reference to FIG. 9. However, as an alternative embodiment, the steps of this method can be executed in a different order. Some steps can be omitted. The described example does not preclude that, in other embodiments, other steps are implemented in conjunction and/or sequentially with the described steps.

During a preliminary step 100, the method is initialized, while the electromagnetic actuator 30 is in a stable position, for example, a stable closed position.

Then, during a step 110, values of the coil current $I_{BOB}$ are measured by means of sensors associated with the coil 32, while the actuator 30 is kept in a stable position.

Then, in a step 120, one or more values of a magnetic flux of the coil 32 are computed by means of the electronic control device 40 of the contactor 1, from the measured coil current value $I_{BOB}$ and using previously known coil voltage values $U_{BOB}$ and coil resistance values $R_{BOB}$.

Then, during a step 130, the one or more magnetic flux values are normalized.

During a step 140, which can be before, after or together with step 130, as applicable, at least one further electrical quantity of the contactor 1 is measured. Optionally, one or more of these electrical quantities measured in step 140 is/are used to compute other electrical quantities in a step 150.

A first example of another electrical quantity is the coil inductance $L_{BOB}$, which is computed, in step 150, from coil current measurements $I_{BOB}$ taken in step 140 by means of the sensors Rsh associated with the coil 32.

A second example of another electrical quantity is the integral 92 of the difference between the coil current $I_{BOB}$ and the second current threshold $I_{CUSP}$, which is computed, in step 150, from measurements taken during the dynamic phase P21 of the closing phase P2 as previously defined.

Then, during a step 160, at least one of the electrical quantities measured in step 140 or computed in step 150 is normalized.

Then, during a step 170, subsequent to steps 130 and 160, the normalized value of the magnetic flux $\phi$, obtained in step 130, is combined with at least one other normalized electrical quantity of the contactor 1, obtained in step 160, in order to arrive at an overall indicator of the state of the contactor 1.

Advantageously, during the step 100 the freewheeling phase corresponds to a decreasing portion P322 of a test phase P32, which is preceded by a stable portion P31 of the holding phase P3, during which the actuator 30 is energized in a stable closing position and the coil current $I_{BOB}$ is stable, then step 120 is preceded by a step 180, during which the coil resistance $R_{BOB}$ is computed, during this stable portion P31, by the ratio of the coil voltage $U_{BOB}$ divided by the coil current $I_{BOB}$, in other words from Ohm's law $$R_{BOB} = \frac{V_{BOB}}{I_{BOB}}.$$

Thus, at the end of step 180, a precise measurement of the coil resistance $R_{BOB}$ is obtained, particularly taking into account the temperature of the coil 32. In step 120, the computation of the magnetic flux $\phi$, which is performed using the measured value of the coil resistance $R_{BOB}$ rather than a value previously recorded in the electronic control device 40, is thus more precise. Of course, when a measured value of the coil resistance $R_{BOB}$ is available, this measured value is also used to compute other electrical quantities, in particular the coil inductance $L_{BOB}$, computed in step 150.

The overall indicator obtained in step 170 is then advantageously combined, during a step 230, with one or more other complementary electrical quantities, which are measured and then optionally normalized.

A first example of a complementary electrical quantity is a pole current, which is measured in a step 190, then optionally normalized in a step 200. A second example of a complementary electrical quantity is a control state of the electronic control device 40, which is measured in a step 210, then optionally normalized in a step 220.

In the illustrated example, the electrical quantities are measured while the switching apparatus 1 is in a stable closed state or even in a closed phase. The principles described are applicable to the case whereby the switching apparatus 1 is in the stable open state. As an alternative embodiment, not shown, when the coil current $I_{BOB}$ is zero, the electronic control device 40 adjusts the duty cycle $\alpha$ in order to generate a spike of coil current $I_{BOB}$ that is strictly lower than the drop-out current $I_D$. The duty cycle $\alpha$ is then cancelled: the switching apparatus 1 is then in freewheeling mode. It is then possible, during this freewheeling phase, to measure several electrical quantities, such as the coil inductance $L_{BOB}$, according to the principles described above, or even a magnetic flux $\Delta\phi_{DOWN}$, etc. These electrical quantities are then normalized and combined together so as to form an overall indicator of the states of the electromagnetic actuator 30.

The aforementioned embodiments and alternative embodiments can be combined together to generate new embodiments of the invention.

The invention claimed is:

1. A method for estimating a state of an electrical switching apparatus, the switching apparatus comprising separable electrical contacts set up to be coupled to an electrical conductor, and an electromagnetic actuator, controlled by a control circuit and comprising a movable core, coupled to the separable contacts, and a coil, which is passed through by a coil current,
wherein the method comprises:
measuring, by means of sensors associated with the coil, values of the coil current during a time interval, while the electromagnetic actuator is kept in a stable position;
computing, by means of an electronic control device of the switching apparatus, one or more values of a magnetic flux of the coil from the measured coil current values, and using previously known coil voltage and coil resistance values; and
using the computed one or more values of the magnetic flux of the coil to estimate the state of the electrical switching apparatus.

2. The method according to claim 1, wherein the one or more values of a magnetic flux are computed by integrating the following formula:

$$\phi = \int \frac{U_{BOB} - R_{BOB} \cdot I_{BOB}}{N_{BOB}} dt$$

where $\phi$ is the magnetic flux, $U_{BOB}$ is the previously known coil voltage, $R_{BOB}$ is the coil resistance, $I_{BOB}$ is the coil current, and $N_{BOB}$ is a number of turns of the coil.

3. The method according to claim 1, wherein a first value of the magnetic flux is computed from measurements of the coil current taken while the switching apparatus is in a freewheeling mode, in which the coil voltage is passively limited by the control circuit, while the coil current decreases freely, with the electrical energy being mainly dissipated by the coil resistance.

4. The method according to claim 3, wherein a second value of the magnetic flux is computed from measurements of the coil current taken during an increasing portion that immediately precedes the freewheeling phase during which the measurements of the coil current are taken that are used for computing the first value of magnetic flux, with the coil voltage being imposed by the control circuit.

5. The method according to claim 4, wherein the first magnetic flux value and the second magnetic flux value are computed from measurements of the coil current that are taken during a closing phase of the switching apparatus.

6. The method according to claim 4, wherein a coil current spike is applied using the electronic control device during a test phase included in a holding phase of the switching apparatus, during which the coil current has a holding current value that is strictly greater than a stall value of the coil current, below which the electromagnetic actuator is not kept energized in the closed position, with the trend of the coil current having an increasing portion, during which the measurements of the coil current are taken that are used for computing the second value of the magnetic flux, and a decreasing portion, during which the measurements of the coil current are taken that are used for computing the first value of the magnetic flux.

7. The method according to claim 6, wherein the coil resistance is measured during a stable portion of the holding phase, which precedes the test phase, with the measured value of the coil resistance then being used in computing the second value of the magnetic flux and the first value of the magnetic flux during said test phase.

8. The method according to claim 1, wherein the one or more computed values of magnetic flux are normalized and combined with at least one other measured and/or computed electrical quantity of the switching apparatus, with each other electrical quantity measurement also being normalized, so as to arrive at an intermediate indicator of the state of the electromagnetic actuator.

9. The method according to claim 8, wherein:
a closing phase of the switching apparatus comprises a dynamic phase, during which the coil voltage is controlled by the electronic control device, followed by a transition phase, during which the switching apparatus is in a freewheeling mode;

during the dynamic phase the trend of the coil current increases a first time beyond a first threshold, which is linked to a drop-out current of the switching apparatus, beyond which the movable core starts to move from its open position to its closed position, then the trend of the coil current decreases below the first threshold, reaches a minimum value, and then rises a second time above the first threshold;

a second threshold of the coil current is defined, with the second threshold being between the first threshold and the minimum value;

while the measured coil current is less than the second threshold, and provided that the trend of the coil current exceeds the first threshold a second time, an integral of the difference between the coil current and the second threshold is computed over a time interval defined between a first instant, when the trend of the coil current decreases below the second threshold, and a second instant, when the coil current again rises above the second threshold, and wherein said integral is one of the other electrical quantities combined to form the intermediate indicator.

10. The method according to claim 8, wherein:

the values of the coil current are measured over the time interval by means of the sensors associated with the coil, while the electromagnetic actuator is kept in the stable position, and the switching apparatus is in a freewheeling mode, in which the coil voltage is passively limited by the control circuit, while the coil current decreases freely, with the electrical energy being mainly dissipated by the coil resistance;

a coil inductance value of the coil is computed by means of an electronic control device of the switching apparatus from the measured coil current value and using previously known coil voltage and coil resistance values;

and wherein the coil inductance is one of the other electrical quantities used to form the intermediate indicator.

11. The method according to claim 10, wherein the electromagnetic actuator comprises a magnetic circuit made of a material, wherein the coil inductance is computed from measurements of the coil current taken from an area of the coil current where the material of the magnetic circuit has magnetic saturation of less than 80% of a maximum magnetic saturation of the material.

12. The method according to claim 11, wherein the coil inductance is computed from measurements of the coil current taken from an area of the coil current where the material of the magnetic circuit has magnetic saturation of less than 50% of a maximum magnetic saturation of the material.

13. The method according to claim 10, wherein measuring the coil current and computing the coil inductance are repeated over several time intervals, with an average inductance value being deduced from the coil inductance values computed during each time interval, wherein each time interval has a duration ranging between 0.01 ms and 10 ms, and wherein the value of the coil inductance is averaged over at least ten time intervals.

14. The method according to claim 13, wherein each time interval has a duration ranging between 0.1 ms and 1 ms.

15. The method according to claim 13, wherein each time interval has a duration equal to 0.2 ms.

16. The method according to claim 13, wherein the value of the coil inductance is averaged over at least twenty time intervals.

17. The method according to claim 8, wherein one of the other measurements of electrical quantity is a measurement of a pole current, passing through a pole of the electrical conductor, and/or a control state of the electronic control device.

18. The method according to claim 1, wherein the stable position is a closed position.

19. An electrical switching apparatus configured to be coupled to an electrical conductor and comprising:

separable contacts, configured to be moved between an open position and a closed position by an electromagnetic actuator comprising a coil and a movable core linked to the separable contacts;

a control circuit configured to control electrical voltage at terminals of the coil, the control circuit comprising a fallback device configured to be selectively activated to reduce electrical current passing through the coil, with the voltage at the terminals of the coil and the fallback device being activated or deactivated according to states of the control circuit;

sensors associated with the coil for measuring the current passing through the coil;

an electronic control device, configured to receive opening and closing commands from the switching apparatus, to receive values of the measured current passing through the coil and to control the states of the control circuit;

wherein, while the electromagnetic actuator is kept in a stable position, the switching apparatus is configured to:

measure, by means of the sensors associated with the coil, values of current passing through the coil during a time interval;

compute, by means of the electronic control device, a value of a magnetic flux of the coil from the measured values of the current passing through the coil during the time interval, and using previously known values of voltage at the terminals of the coil and coil resistance; and use the computed value of the magnetic flux of the coil to estimate a state of the electrical switching apparatus.

20. The electrical switching apparatus according to claim 19, wherein the stable position is a closed position.

* * * * *